(12) United States Patent
Jain et al.

(10) Patent No.: US 11,249,134 B1
(45) Date of Patent: Feb. 15, 2022

(54) POWER-COLLAPSIBLE BOUNDARY SCAN

(71) Applicant: QUALCOMM INCORPORATED, San Diego, CA (US)

(72) Inventors: Varun Jain, San Diego, CA (US); Todd Christopher Reynolds, Santee, CA (US); Xinyi Chang, San Diego, CA (US); Anuj Gangan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/064,220

(22) Filed: Oct. 6, 2020

(51) Int. Cl.
*G01R 31/3177* (2006.01)
*G06F 11/26* (2006.01)
*G01R 31/3185* (2006.01)
*G01R 31/28* (2006.01)

(52) U.S. Cl.
CPC ..... *G01R 31/3177* (2013.01); *G01R 31/2815* (2013.01); *G01R 31/318533* (2013.01); *G06F 11/26* (2013.01)

(58) Field of Classification Search
CPC ............ G01R 31/3177; G01R 31/2815; G01R 31/318533; G06F 11/26
USPC ................................ 714/727, 724, 726, 729
See application file for complete search history.

(56) References Cited

U.S. PATENT DOCUMENTS

| | | | | |
|---|---|---|---|---|
| 5,477,545 A * | 12/1995 | Huang | ............ | G01R 31/318541 324/762.02 |
| 5,615,217 A * | 3/1997 | Horne | ............ | G01R 31/318558 714/727 |
| 5,673,276 A * | 9/1997 | Jarwala | .......... | G01R 31/318513 714/727 |
| 5,768,289 A * | 6/1998 | James | ............ | G01R 31/318586 714/727 |
| 8,040,152 B1 * | 10/2011 | Han | ...................... | H03K 19/177 326/38 |
| 8,904,253 B2 * | 12/2014 | Menon | .................. | G06F 1/3287 714/727 |
| 9,791,505 B1 * | 10/2017 | Narayanan | ..... | G01R 31/318572 |
| 2001/0025356 A1 * | 9/2001 | Whetsel | ......... | G01R 31/318536 714/727 |
| 2003/0079166 A1 * | 4/2003 | Vermeulen | ..... | G01R 31/318558 714/727 |

(Continued)

OTHER PUBLICATIONS

Wang et al., A Novel Structure of Dynamic Configurable Scan Chain Bypassing Unconcerned Segments on the Fly, 2013, IEEE, pp. 1-4. (Year: 2013).*

*Primary Examiner* — John J Tabone, Jr.
(74) *Attorney, Agent, or Firm* — Smith Tempel Blaha LLC/Qualcomm

(57) ABSTRACT

Physical or off-chip interfaces may be selectively bypassed in a boundary scan chain. A bypass control signal may be produced that indicates whether to bypass a selected one of the interfaces. In response to a first state of a bypass control signal, a multiplexer may couple the scan chain output of an interface boundary scan cell to the scan chain input of a successor boundary scan cell of the interface boundary scan cell. In response to a second state of the bypass control signal, the multiplexer may couple the scan chain output of a predecessor boundary scan cell of the interface boundary scan cell to the scan chain input of the successor boundary scan cell, bypassing the interface boundary scan cell.

14 Claims, 10 Drawing Sheets

(56) References Cited

U.S. PATENT DOCUMENTS

| | | | |
|---|---|---|---|
| 2004/0187059 A1* | 9/2004 | Whetsel | G01R 31/318536 714/727 |
| 2004/0268196 A1* | 12/2004 | Chau | G01R 31/318558 714/726 |
| 2012/0216089 A1 | 8/2012 | Chen et al. | |
| 2013/0173976 A1* | 7/2013 | Tekumalla | G01R 31/318536 714/726 |
| 2013/0346816 A1* | 12/2013 | Menon | G01R 31/2815 714/727 |
| 2021/0159840 A1* | 5/2021 | Thomas | H02P 29/028 |

\* cited by examiner

POWER-COLLAPSIBLE BOUNDARY SCAN

DESCRIPTION OF THE RELATED ART

Portable computing devices ("PCD"s) are becoming necessities for people on personal and professional levels. These devices may include mobile phones, tablet computers, palmtop computers, portable digital assistants ("PDA"s), portable game consoles, and other portable electronic devices. PCDs commonly contain integrated circuits or systems-on-a-chip ("SoC"s) that include numerous subsystems designed to work together to deliver functionality to a user. For example, an SoC may contain any number of processing engines or other subsystems, such as central processing units ("CPU"s) with multiple cores, graphical processing units ("GPU"s), digital signal processors ("DSP"s), wireless transceiver units (also referred to as modems), etc. An SoC may also include peripheral device interfaces, such as one or more Universal Serial Bus ("USB") interfaces. In addition to one or more SoCs, a PCD may include components such as memory chips, power management chips, audio amplifiers, microphones, speakers, cameras, etc. Each such component has pins that may be soldered to lands or pads on a printed circuit board ("PCB"). The PCB has electrically conductive (e.g., copper) traces that provide signal paths between the pads, and thus between pins of the various chips and other components.

An SoC subsystem may include off-chip interface circuitry, also referred to as a physical interface or PHY, which interfaces the core logic of a subsystem to associated SoC signal pins. In addition to the signal pins, an SoC may include power supply pins through which the physical interfaces may receive the power needed for their operation.

Although an SoC or similar chip may have many subsystems, a PCD may not utilize all of their physical interfaces. The power supply pins associated with unused interfaces may be tied to ground to help minimize leakage current and thereby conserve battery power.

Boundary scan is a testing technology developed by the Joint Test Action Group ("JTAG"), an industry consortium. A chip, such as an SoC, may include JTAG circuitry that enables signals on individual pins to be input and output in a test mode. A circuit element known as a boundary scan "cell" in the physical interface is interposed in the input/output data signal path between subsystem core logic and the corresponding signal pin. The boundary scan cells are arranged in a chain to form a serial scan path. The JTAG circuitry enables the boundary scan cells to be written to and read back by shifting test data serially through the chain of cells. Such a boundary scan test feature can be used not only to test a chip but also to test the integrity of the signal paths or traces between chips on a PCB.

SUMMARY OF THE DISCLOSURE

Systems, methods, computer program products, and other embodiments are disclosed for selectively bypassing off-chip interfaces in a boundary scan chain of an integrated circuit chip.

An exemplary method for selectively bypassing off-chip interfaces in a boundary scan chain of an integrated circuit chip may include producing a bypass control signal indicating whether to bypass an interface boundary scan cell coupled between a predecessor boundary scan cell and a successor boundary scan cell in the boundary scan chain. The method may further include coupling, in response to a first state of the bypass control signal, an output of the interface boundary scan cell to an input of the successor boundary scan cell. The method may also include coupling, in response to a second state of the bypass control signal, an output of the predecessor boundary scan cell to an input of the successor boundary scan cell.

An exemplary system for selectively bypassing off-chip interfaces in a boundary scan chain of an integrated circuit chip may include an interface boundary scan cell in the boundary scan chain, a predecessor boundary scan cell preceding the interface boundary scan cell in the boundary scan chain, and a successor boundary scan cell succeeding the interface boundary scan cell in the boundary scan chain. The system may further include a multiplexer having a first input coupled to an output of the interface boundary scan cell, a second input coupled to an output of the predecessor boundary scan cell, and an output coupled to an input of the successor boundary scan cell. The output of the predecessor boundary scan cell may be coupled to an input of the interface boundary scan cell. The system may also include bypass control logic configured to produce a bypass control signal controlling whether the multiplexer selects the first input or the second input.

Another exemplary system for selectively bypassing off-chip interfaces in a boundary scan chain of an integrated circuit chip may include a plurality of subsystem off-chip interfaces. Each subsystem off-chip interface may be included in one of a corresponding plurality of power domains of the integrated circuit chip. Each subsystem off-chip interface may include at least one of the interface boundary scan cells of the boundary scan chain. The system may further include a plurality of multiplexers, each of which may be associated with one of the subsystem off-chip interfaces. Each multiplexer may have a first input coupled to an output of the interface boundary scan cell, a second input coupled to an output of a predecessor boundary scan cell preceding the interface boundary scan cell in the boundary scan chain, and an output coupled to an input of a successor boundary scan cell succeeding the interface boundary scan cell in the boundary scan chain. The output of the predecessor boundary scan cell may be further coupled to an input of the interface boundary scan cell. The system may also include bypass control logic configured to produce a plurality of bypass control signals, each controlling whether a corresponding one of the plurality of multiplexers selects the first input or the second input.

Still another system for selectively bypassing off-chip interfaces in a boundary scan chain of an integrated circuit chip may include means for producing a bypass control signal indicating whether to bypass an interface boundary scan cell coupled between a predecessor boundary scan cell and a successor boundary scan cell in the boundary scan chain. The system may further include means for coupling, in response to a first state of the bypass control signal, an output of the interface boundary scan cell to an input of the successor boundary scan cell. The system may also include means for coupling, in response to a second state of the bypass control signal, an output of the predecessor boundary scan cell to an input of the successor boundary scan cell.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects. The term "coupled" is used herein to mean connected via zero or more intervening elements. The term "directly connected" may be used herein to mean connected via zero intervening elements.

Figure 1:
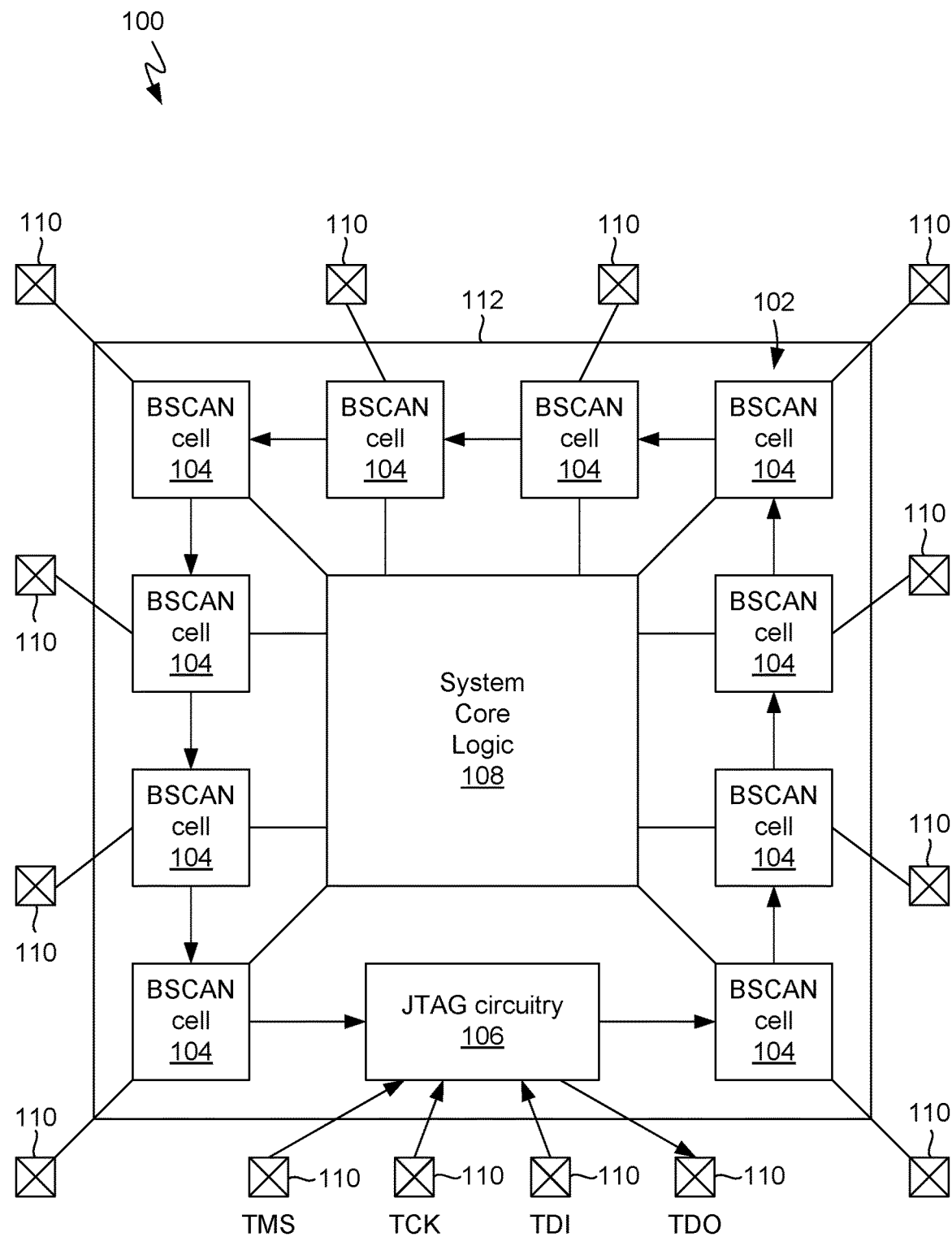
FIG. 1 is a block diagram illustrating an integrated circuit chip having a boundary scan chain, in accordance with the prior art.

As illustrated in FIG. 1, a conventional or prior art integrated circuit chip 100 may include a boundary scan feature in accordance with the testing standard known as Institute of Electrical and Electronic Engineers ("IEEE") standard 1149.1: Standard Test Access Port and Boundary Scan Architecture. The boundary scan feature and standard are also commonly referred to as "JTAG" boundary scan, a reference to the Joint Test Action Group whose findings and recommendations were used as the basis for IEEE standard 1149.1.

The boundary scan feature is based on a boundary scan chain 102, sometimes also referred to as a boundary scan register ("BSR"). The boundary scan chain 102 may comprise any number of boundary scan ("BSCAN") cells 104 arranged in a chain. That is, a scan chain input of one of the boundary scan cells 104 is coupled to a scan chain output of another of the boundary scan cells 104. Boundary scan testing is controlled by JTAG circuitry 106, which is commonly interposed between the first and last boundary scan cells 104 in the boundary scan chain 102. Each boundary scan cell 102 is interposed in an input/output (i.e., input, output, or bidirectional) data signal path between system core logic 108 and a respective or associated signal pin 110 of the chip 100. The system core logic 108 may also be referred to as application logic, as it represents the logic that effects the application(s) or mission-mode function(s) of the chip 100, as opposed to testing or diagnostic functions. Although only the signal pins 110 are shown in FIG. 1 for purposes of clarity, the chip 100 includes additional pins through which the chip 100 may be supplied with power, as well as pins that may be connected to ground.

Each boundary scan cell 104 is configured not only to transparently buffer data communicated between the system core logic 108 and the associated pin 110 but also to capture the logic state or data value on the associated pin 110. Thus, in addition to a scan chain input connection and a scan chain output connection, each boundary scan cell 104 has two input/output data connections, one connected to the system core logic 108 and the other connected to the associated pin 110.

The JTAG circuitry 106 enables the boundary scan chain 102 to be written to and read back by shifting test data serially through its constituent boundary scan cells 104. As the boundary scan cells 104 reflect the data values on the associated pins 110, the data values on the associated pins 110 may be read or output by shifting the data serially through the boundary scan cells 104 and then out of the chip 100 through a pin 110 commonly referred to as test data out ("TDO"). Similarly, as the boundary scan cells 104 can set or establish data values on the associated pins 110, the data values on the associated pins 110 may be set or input by shifting the data serially into the chip 100 through a pin 110 commonly referred to as test data out ("TDI") and then through the boundary scan cells 104. With respect to the direction in which data values are shifted through the boundary scan chain 102, a first boundary scan cell 104 having an output coupled to an input of a second boundary scan cell 104 may be referred to as a "predecessor" of the second boundary scan cell 104, and the second boundary scan cell 104 may be referred to as a "successor" of the first boundary scan cell 104. The JTAG circuitry 106 may shift the data using a clock signal provided through a corresponding test clock ("TCK") pin 110. Whether the JTAG circuit 106 reads data from the chip 100 or writes data to the chip 100 in the above-described manner may be determined by a mode signal provided through a corresponding test mode select ("TMS") pin 110. The boundary scan cells 104 are included on the same die 112 as the system core logic 108, the JTAG circuitry 106, and other elements of the chip 100.

Figure 2:
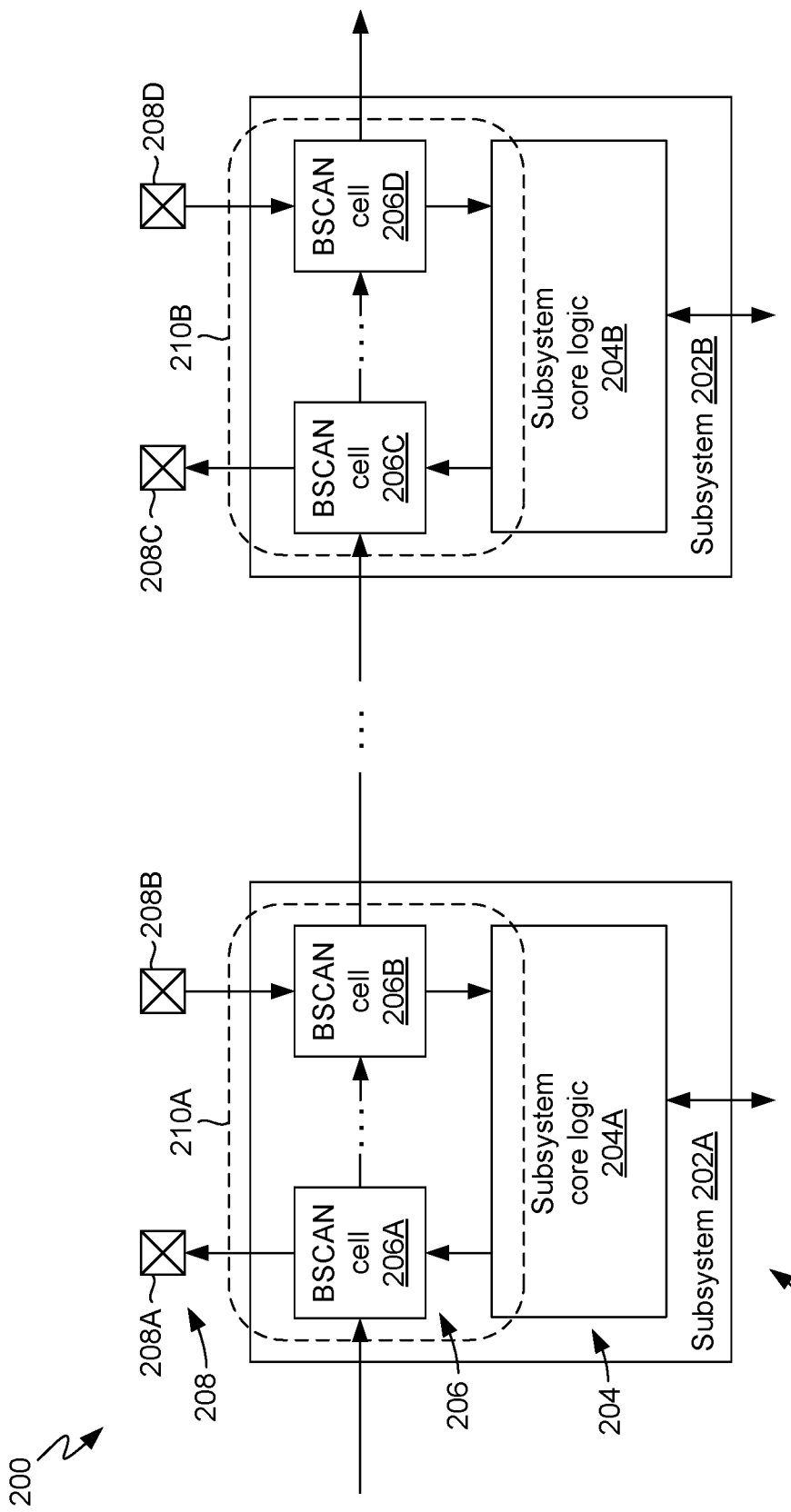
FIG. 2 is a block diagram illustrating a portion of a boundary scan chain of an integrated circuit chip, in accordance with the prior art.

As illustrated in FIG. 2, a chip 200 having an architecture that is a variant of the above-described architecture of the chip 100 (FIG. 1) may include two or more subsystems 202, such as subsystems 202A, 202B, etc., instead of, or in addition to, above-described system core logic 108 (FIG. 1). Further subsystems 202 that may be included but are not individually shown for purposes of clarity are indicated by the ellipsis symbol (" . . . ") between the subsystems 202A and 202B. The subsystems 202 may include subsystem core logic 204. For example, the subsystems 202A and 202B may include core logic 204A and 204B, respectively. Although not shown for purposes of clarity, the various subsystems 202 may communicate with each other or with other elements of the chip 200 via one or more internal busses or interconnects, as conceptually indicated by the double-ended arrows. The chip 200 may include signal pins 208, such as pins 208A, 208B, 208C, 208D, etc., as well as power supply and ground pins (not shown).

In the architecture shown in FIG. 2, a boundary scan chain may include boundary scan cells 206, such as boundary scan cells 206A, 206B, 206C, 206D, etc. Boundary scan cells 206A and 206B may be interposed between subsystem core logic 204A and pins 208A and 208B, respectively. Boundary scan cells 206C and 206D may be interposed between subsystem core logic 204B and pins 208C and 208D, respectively. Further boundary scan cells 206 that may be included in the boundary scan chain but are not individually shown for purposes of clarity are indicated by the ellipsis symbol (" . . . ") between the boundary scan cells 206A and 206B, between the boundary scan cells 206B and 206C, and between the boundary scan cells 206C and 206D, etc. Note that for purposes of clarity in FIG. 2 only a portion of the entire boundary scan chain is shown, and JTAG circuitry that controls the boundary scan test is not shown. In the portion shown in FIG. 2, the scan chain output of the boundary scan cell 206A is connected to the scan chain input of the boundary scan cell 206B, the scan chain output of the boundary scan cell 206B is connected to the scan chain input of the boundary scan cell 206C, and the scan chain output of the boundary scan cell 206C is connected to the input of the boundary scan cell 206D. In the chip 200, the boundary scan feature may operate in essentially the same manner as described above with regard to the chip 100 (FIG. 1). That is, JTAG circuitry may shift data values through the boundary scan cells 206A-206D as well as all other boundary scan cells 206 that form the boundary scan chain.

A portion of the subsystem 202 that includes one or more boundary scan cells 206 as well as a portion of the associated subsystem core logic 204 may be referred to as an off-chip interface 210 (sometimes also referred to as a physical interface or "PHY") because it carries data signals between the pins 208 and the remaining portions of the subsystem core logic 204. For example, the subsystems 202A and 202B may include off-chip interfaces 210A and 210B, respectively. Although for purposes of clarity only the pins 110 that carry data signals are shown in FIG. 2, the chip 100 includes additional pins through which the chip 200 may be supplied with power.

Although a chip may have many subsystems, a computing device of which the chip is a part may not utilize all of their off-chip interfaces. For example, there may be six off-chip camera interfaces to accommodate up to six cameras, yet an original equipment manufacturer or "OEM" may design a computing device having only two cameras, each coupled to a respective camera interface. That is, some of the camera interfaces may be unused. The power supply voltage (and ground) pins associated with the other four, unused camera interfaces may be tied to ground to help minimize leakage current and thereby conserve battery power, or the power domain supplying the interface may be collapsed (i.e., deactivated) in some other manner. Data cannot be shifted through a boundary scan cell that is not powered. Embodiments described below of systems and methods for selectively bypassing off-chip interfaces in a boundary scan chain address this deficiency in the prior art.

Figure 3:
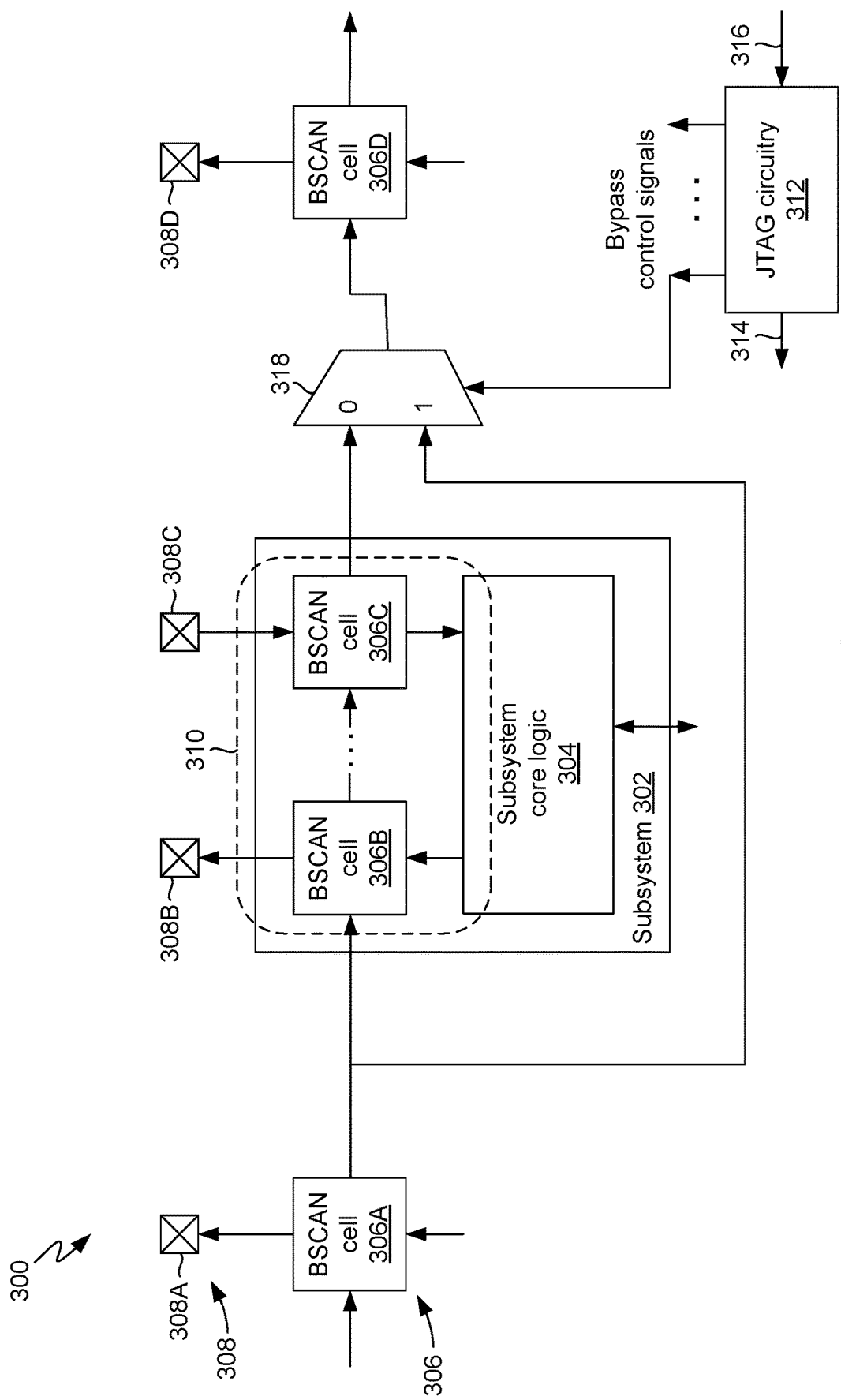
FIG. 3 is a block diagram illustrating a system for selectively bypassing off-chip interfaces in a boundary scan chain, in accordance with exemplary embodiments.

As illustrated in FIG. 3, a chip 300 may include one or more subsystems 302, each having subsystem core logic 304. The chip 300 may be, for example, an SoC having numerous subsystems 302 and power domains. Although not shown for purposes of clarity, each subsystem 302 may communicate with other subsystems 302 of the chip 300 through, for example, one or more internal busses or similar data communication interconnects. The chip 300 may include signal pins 308, such as pins 308A, 308B, 308C, 308D, etc., as well as power supply and ground pins (not shown).

The chip 300 may have a boundary scan chain that includes boundary scan cells 306, such as boundary scan cells 306A, 306B, 306C, 306D, etc. The boundary scan cells 306B and 306C are interposed in input/output data signal paths between the subsystem core logic 304 and respective or associated signal pins 308B and 308C. Although any boundary scan cell 306 may be configured as an input, output or bidirectional data buffer, in the illustrated example: the boundary scan cell 306B may be configured as an output buffer, i.e., to buffer data provided by the subsystem core logic 304 to the pin 308B; and the boundary scan cell 306C may be configured as an input buffer, i.e., to buffer data provided by the pin 308C to the subsystem core logic 304. The boundary scan cells 306A and 306D may similarly be configured as output buffers in the illustrated example.

A physical interface or off-chip interface 310 includes boundary scan cells 306B, 306C, etc., as well as a portion of the associated subsystem core logic 304. The off-chip interface 310 may be, for example, a multi-lane serial interface, a USB interface, a PCIe interface, or any other type of interface not inconsistent with the present disclosure.

In the portion of the boundary scan chain shown in FIG. 3, the scan chain output of the boundary scan cell 306A is connected to the scan chain input of the boundary scan cell 306B, the scan chain output of the boundary scan cell 306B is connected to the scan chain input of the boundary scan cell 306C, and the scan chain output of the boundary scan cell 306C is connected to the scan chain input of the boundary scan cell 306D. In the illustrated example, while boundary scan cells 306B and 306C are associated with subsystem 302 and subsystem core logic 304, boundary scan cells 306A and 306D may be associated with other subsystems or core logic (not separately shown in FIG. 3 for purposes of clarity).

The chip 300 may include JTAG circuitry 312 that is configured to control the boundary scan cells 306 and thus control a boundary scan test in a conventional manner. Accordingly, first and last boundary scan cells 306 (not separately indicated for purposes of clarity) may be coupled to a scan chain output 314 and scan chain input 316, respectively, of the JTAG circuitry 312. As described below, the JTAG circuitry 312 is not only configured to control a boundary scan test but is also configured as bypass control logic to selectively control bypassing off-chip interfaces 310 in the boundary scan chain.

The subsystem 302 or a portion thereof, such as the off-chip interface 310, may be supplied with the power necessary for it to operate through a power domain that is different or distinct from one or more other power domains through which one or more other subsystems 302 (not shown in FIG. 3 for purposes of clarity) are supplied with power. The power domain supplying the subsystem 302 or its off-chip interface 310 may be powered through the above-mentioned one or more power supply voltage pins.

It may be noted that if the subsystem 302 is not supplied with power, the off-chip interface 310 is not operational, including the associated boundary scan cells 306B, 306C, etc. If the subsystem 302 is not supplied with power, the boundary scan chain is interrupted, and a conventional boundary scan test involving the off-chip interface 310 cannot be performed. Bypassing or excluding unpowered off-chip interfaces 310 from the boundary scan chain in a manner described below maintains the ability to perform a boundary scan test involving other (powered) off-chip interfaces 310.

The chip 300 may further include one or more multiplexers 318, each of which may be associated with one of the off-chip interfaces 310. In the embodiment illustrated in FIG. 3: a first input of the multiplexer 318 is directly connected to the scan chain output of the (interface) boundary scan cell 306C of the interface 310; a second input of the multiplexer 318 is directly connected to the scan chain output of the (predecessor) boundary scan cell 306A (i.e., which precedes the boundary scan cell 306C in the boundary scan chain); and the output of the multiplexer 318 is directly connected to a scan chain input of the (successor) boundary scan cell 306D (i.e., which succeeds or follows the boundary scan cell 306C in the boundary scan chain).

In the embodiment illustrated in FIG. 3, the JTAG circuitry 312 is configured to produce one or more bypass control signals, each coupled to the selector input of a respective multiplexer 318. The bypass control signals may reflect the contents of a data register (not separately shown) in the JTAG circuitry 312. As well understood by one of ordinary skill in the art, some of the JTAG signals described above with regard to FIG. 1 (e.g., TMS, TCK, TDI) can be used to write a value to such a JTAG data register.

In response to a bypass control signal, the multiplexer 318 selects one of its above-referenced first and second inputs. For example, in response to the bypass control signal having a value of "0" the multiplexer 318 may select its first input to couple to its output, and in response to the bypass control signal having a value of "1" the multiplexer 318 may select its second input to couple to its output. In the embodiment illustrated in FIG. 3, if the bypass control signal has a value of "0" the multiplexer 318 does not bypass or exclude the boundary scan cells 306B, 306C, etc., of the interface 310 from the boundary scan chain but rather passes the signal from the boundary scan cell 306C to the boundary scan cell 306D. In the embodiment illustrated in FIG. 3, if the bypass control signal has a value of "1" the multiplexer 318 passes the signal from the boundary scan cell 306A to the boundary scan cell 306D, effectively bypassing or excluding the boundary scan cells 306B, 306C, etc., of the interface 310 from the boundary scan chain. In summary, the multiplexer 318 is configured in the embodiment illustrated in FIG. 3 to selectively bypass the off-chip interface 310 in response to a bypass control (i.e., selection) signal provided by a JTAG data register of the JTAG circuitry 312. In the embodiment illustrated in FIG. 3, the multiplexer 318 is configured to bypass not only the boundary scan cell 306C to which it is directly connected but also any number of additional boundary scan cells 306B, etc., that may be included in the off-chip interface 310.

More generally, in other embodiments, the first input of such a multiplexer may be coupled to the scan chain output of any interface boundary scan cell, i.e., any boundary scan cell of the associated off-chip interface. The second input of such a multiplexer may be coupled to the scan chain output of any other boundary scan cell of the off-chip interface that precedes that interface boundary scan cell in the boundary scan chain, or still more generally, to the scan chain output of any predecessor boundary scan cell, i.e., any boundary scan cell that precedes that interface boundary scan cell in the boundary scan chain. That is, in such other embodiments (not shown) there may be any number of intervening boundary scan cells between an interface boundary scan cell and a predecessor boundary scan cell, and any such intervening boundary scan cells are also predecessor boundary scan cells of the interface boundary scan cell. Further, in such other embodiments the output of the multiplexer may be coupled to the scan chain input of any successor boundary scan cell, i.e., any boundary scan cell that succeeds or follows the interface boundary scan cell in the boundary scan chain. That is, in such other embodiments (not shown) there may be any number of intervening boundary scan cells between an interface boundary scan cell and a successor boundary scan cell, and any such intervening boundary scan cells are also successor boundary scan cells of the interface boundary scan cell. It may be noted that in such other embodiments the boundary scan output of the predecessor boundary scan cell is further coupled to the boundary scan input of the interface boundary scan cell.

Also, in such other embodiments (not shown), the multiplexer may be included in a selector circuit along with one or more other multiplexers or similar selector circuitry, and the selector circuit may be configured to bypass one or more boundary scan cells in response to one or more bypass control signals provided by the bypass control logic. Further, although in the illustrated embodiments the multiplexer has exactly two inputs, in other embodiments a multiplexer may have more than two inputs.

Figure 4:
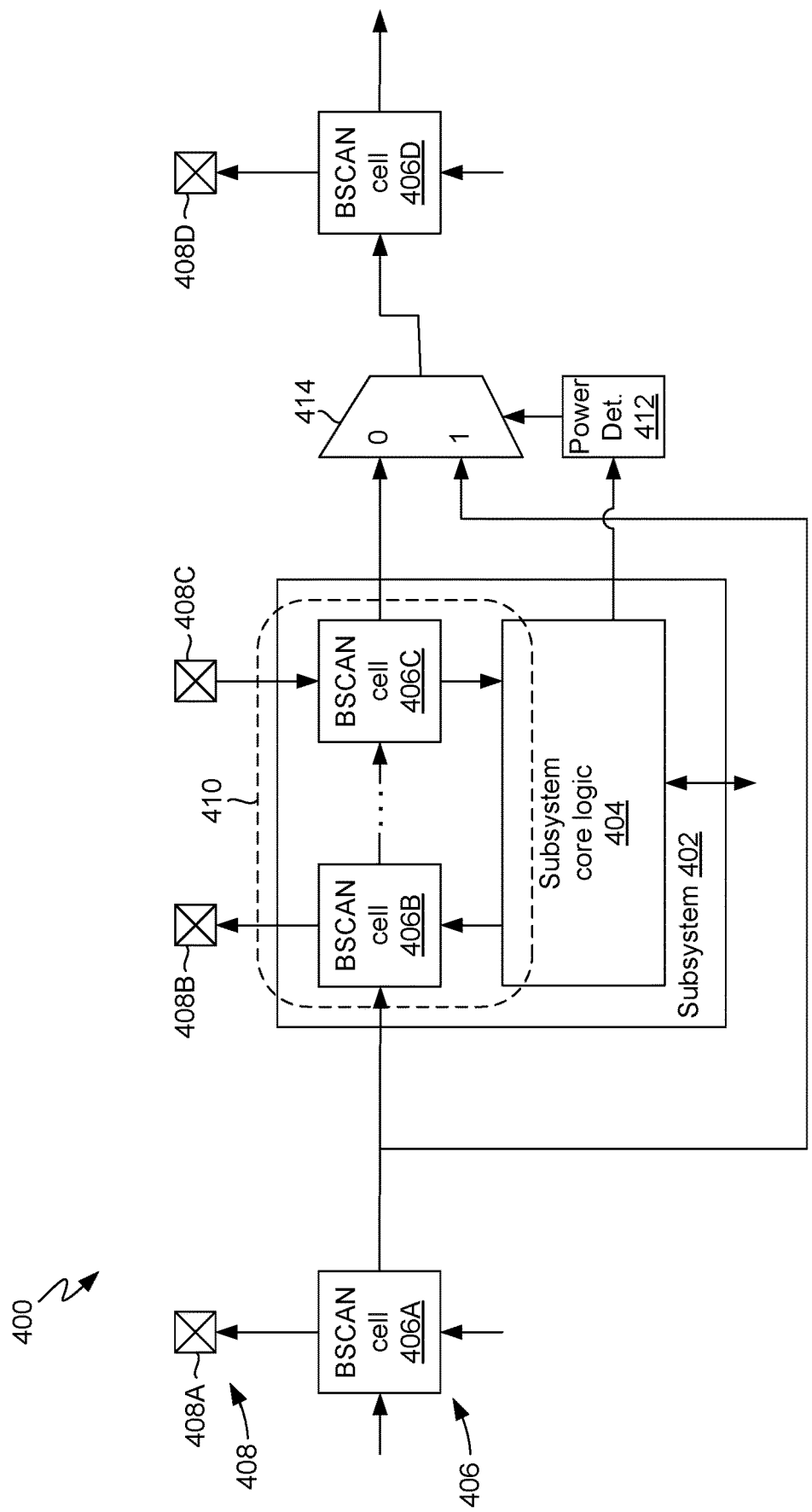
FIG. 4 is a block diagram illustrating another system for selectively bypassing off-chip interfaces in a boundary scan chain, in accordance with exemplary embodiments.

As illustrated in FIG. 4, in another embodiment a chip 400 may include one or more subsystems 402, each having subsystem core logic 404. The chip 400 may be, for example, an SoC having numerous subsystems 402 and power domains. Although not shown for purposes of clarity, each subsystem 402 may communicate with other subsystems 402 of the chip 400 through, for example, one or more internal busses or similar data communication interconnects. The chip 400 may include signal pins 408, such as pins 408A, 408B, 408C, 408D, etc., as well as power supply and ground pins (not shown).

The chip 400 may have a boundary scan chain that includes boundary scan cells 406, such as boundary scan cells 406A, 406B, 406C, 406D, etc. The boundary scan cells 406B and 406C are interposed in input/output data signal paths between the subsystem core logic 404 and respective or associated signal pins 408B and 408C. Although any boundary scan cell 406 may be configured as an input, output or bidirectional data buffer, in the illustrated example: the boundary scan cell 406B may be configured as an output buffer, i.e., to buffer data provided by the subsystem core logic 404 to the pin 408B; and the boundary scan cell 406C may be configured as an input buffer, i.e., to buffer data provided by the pin 408C to the subsystem core logic 404. The boundary scan cells 406A and 406D may similarly be configured as output buffers in the illustrated example.

A physical interface or off-chip interface 410 includes boundary scan cells 406B, 406C, etc., as well as a portion of the associated subsystem core logic 404. The off-chip interface 410 may be, for example, a multi-lane serial interface, a USB interface, a PCIe interface, or any other type of interface not inconsistent with the present disclosure.

In the portion of the boundary scan chain shown in FIG. 4, the scan chain output of the boundary scan cell 406A is connected to the scan chain input of the boundary scan cell 406B, the scan chain output of the boundary scan cell 406B is connected to the scan chain input of the boundary scan cell 406C, and the scan chain output of the boundary scan cell 406C is connected to the scan chain input of the boundary scan cell 406D. In the illustrated example, while boundary scan cells 406B and 406C are associated with subsystem 402 and subsystem core logic 404, boundary scan cells 406A and 406D may be associated with other subsystems or core logic (not separately shown in FIG. 4 for purposes of clarity).

Although not shown in FIG. 4 for purposes of clarity, the chip 400 may include JTAG circuitry that is configured to control the boundary scan cells 406 and thus control a boundary scan test in a conventional manner. Unlike in the embodiment described above with regard to FIG. 3, in this embodiment the JTAG circuitry is not configured as bypass control logic. Rather, in this embodiment power signal detection logic 412 is included and configured as bypass control logic to selectively control bypassing the off-chip interface 410 in a manner described below.

Similarly to the subsystem 302 described above with regard to FIG. 3, the subsystem 402 may be supplied with the power necessary for to operate through a power domain that is different or distinct from one or more other power domains through which one or more other subsystems 402 (not shown in FIG. 4 for purposes of clarity) are supplied with power. The power domain supplying the subsystem 402 or its off-chip interface 410 may be powered through the above-mentioned one or more power supply voltage pins.

The chip 400 may further include one or more multiplexers 414, each of which may be associated with one of the off-chip interfaces 410. In the embodiment illustrated in FIG. 3: a first input of the multiplexer 414 is directly connected to the scan chain output of the (interface) boundary scan cell 406C; a second input of the multiplexer 414 is directly connected to the scan chain output of the (predecessor) boundary scan cell 406A; and the output of the multiplexer 414 is directly connected to a scan chain input of the (successor) boundary scan cell 406D.

In the embodiment illustrated in FIG. 4, the power signal detection logic 412 is configured to detect, and to produce a signal indicating, whether the power domain that is configured to supply power to the subsystem 402 or portion thereof (e.g., off-chip interface 410) is powered, i.e., is receiving power through, for example, a power supply pin. This signal indicating whether the power domain is powered serves as a bypass control signal in this embodiment and is accordingly coupled to the selector input of the multiplexer 412.

In response to the bypass control signal, the multiplexer 412 selects one of its above-referenced first and second inputs. For example, in response to the bypass control signal having a value of "0" the multiplexer 412 may select its first input to couple to its output, and in response to the bypass control signal having a value of "1" the multiplexer 412 may select its second input to couple to its output. In the embodiment illustrated in FIG. 4, if the bypass control signal has a value of "0" the multiplexer 412 does not bypass or exclude the boundary scan cells 406B, 406C, etc., of the interface 410 from the boundary scan chain but rather passes the signal from the (interface) boundary scan cell 406C to the (successor) boundary scan cell 406D. In the embodiment illustrated in FIG. 4, if the bypass control signal has a value of "1" the multiplexer 412 passes the signal from the (predecessor) boundary scan cell 406A to the (successor) boundary scan cell 406D, effectively bypassing or excluding the boundary scan cells 406B, 406C, etc., of the interface 410 from the boundary scan chain. In summary, the multiplexer 412 is configured in the embodiment illustrated in FIG. 4 to selectively bypass the off-chip interface 410 in response to a bypass control (i.e., selection) signal provided by the power signal detection logic 412. In the embodiment illustrated in FIG. 4, the multiplexer 412 is configured to bypass not only the boundary scan cell 406C to which it is directly connected but also any number of additional boundary scan cells 406B, etc., that may be included in the off-chip interface 410.

Figure 5:
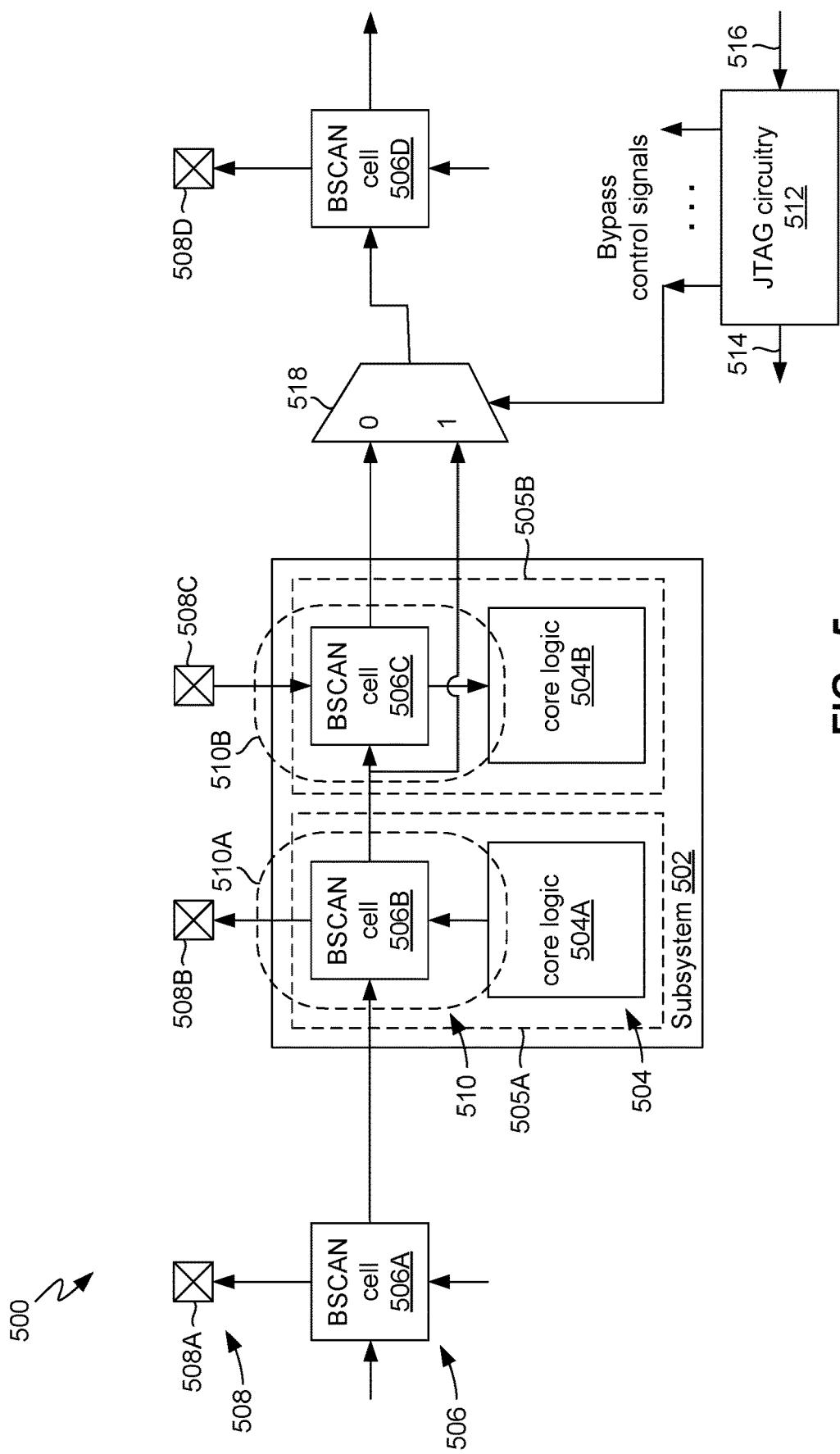
FIG. 5 is a block diagram illustrating still another system for selectively bypassing off-chip interfaces in a boundary scan chain, in accordance with exemplary embodiments.

As illustrated in FIG. 5, in yet another embodiment a chip 500 may include one or more subsystems 502. In this embodiment, the core logic 504 of the subsystem 502 may be distributed, comprising core logic 504A and 504B. Core logic 504A and 504B may be in power domains 505A and 505B, respectively. As in other embodiments described above, the chip 500 may be an SoC having numerous subsystems 502 and power domains. The chip 500 may include signal pins 508, such as pins 508A, 508B, 508C, 508D, etc., as well as power supply and ground pins (not shown).

The chip 500 may have a boundary scan chain that includes boundary scan cells 506, such as boundary scan cells 506A, 506B, 506C, 506D, etc. The boundary scan cells 506B and 506C are interposed in input/output data signal paths between the subsystem core logic 504 and respective or associated signal pins 508B and 508C. Although any boundary scan cell 506 may be configured as an input, output or bidirectional data buffer, in the illustrated example: the boundary scan cell 506B may be configured as an output buffer, i.e., to buffer data provided by the core logic 504A to the pin 408B; and the boundary scan cell 506C may be configured as an input buffer, i.e., to buffer data provided by the pin 508C to the core logic 504B. The boundary scan cells 506A and 506D may similarly be configured as output buffers in the illustrated example.

In this embodiment, the subsystem 502 may have multiple physical or off-chip interfaces 510, such as a first off-chip interface 510A that includes boundary scan cell 506B and a portion of the associated core logic 504A, and a second off-chip interface 510B that includes boundary scan cell 506C and a portion of the associated core logic 504B. Although not shown for purposes of clarity, the chip 500 may further include supply voltage pins through which power may be supplied to the subsystem 502 or portions thereof, such as the off-chip interfaces 510A and 510B. In this embodiment, one or more supply voltage pins may be configured to power off-chip interface 510A (in power domain 505A) and one or more other supply voltage pins may be configured to power off-chip interface 510B (in power domain 505B).

In the portion of the boundary scan chain shown in FIG. 5, the scan chain output of the boundary scan cell 506A is connected to the scan chain input of the boundary scan cell 506B, the scan chain output of the boundary scan cell 506B is connected to the scan chain input of the boundary scan cell 506C, and the scan chain output of the boundary scan cell 506C is connected to the scan chain input of the boundary scan cell 506D. In the illustrated example, boundary scan cells 506B and 506C are associated with core logic 504A and 504B, respectively. Boundary scan cells 506A and 506D may be associated with other subsystems or core logic (not separately shown in FIG. 5 for purposes of clarity).

The chip 500 may include JTAG circuitry 512 that is configured to control the boundary scan cells 506 and thus control a boundary scan test in a conventional manner. Accordingly, first and last boundary scan cells 506 (not separately indicated for purposes of clarity) may be coupled to a scan chain output 514 and scan chain input 516, respectively, of the JTAG circuitry 512.

The chip 500 may further include one or more multiplexers associated with off-chip interfaces. For example, the multiplexer 518 may be associated with the off-chip interface 510B by the following connections: a first input of the multiplexer 518 is directly connected to the scan chain output of the (interface) boundary scan cell 506C; a second input of the multiplexer 518 is directly connected to the scan chain output of the (predecessor) boundary scan cell 506B; and the output of the multiplexer 518 is directly connected to a scan chain input of the (successor) boundary scan cell 506D.

Similarly to the embodiment described above with regard to FIG. 3, the JTAG circuitry 512 is configured to produce one or more bypass control signals, each coupled to the selector input of a respective multiplexer 518. The bypass control signals may reflect the contents of a data register (not separately shown) in the JTAG circuitry 512, as described above with regard to FIG. 3.

In response to the bypass control signal, the multiplexer 518 selects one of its above-referenced first and second inputs. For example, in response to the bypass control signal having a value of "0" the multiplexer 518 may select its first input to couple to its output, and in response to the bypass control signal having a value of "1" the multiplexer 518 may select its second input to couple to its output. In the embodiment illustrated in FIG. 5, if the bypass control signal has a value of "0" the multiplexer 518 does not bypass or exclude the boundary scan cell 506C of the interface 510B from the boundary scan chain but rather passes the signal from the (interface) boundary scan cell 506C to the (successor) boundary scan cell 506D. In the embodiment illustrated in FIG. 5, if the bypass control signal has a value of "1" the multiplexer 518 passes the signal from the (predecessor) boundary scan cell 506B to the (successor) boundary scan cell 506D, effectively bypassing or excluding the (interface) boundary scan cell 506C from the boundary scan chain, while maintaining the boundary scan cell 506B in the boundary scan chain. In summary, in this embodiment the multiplexer 518 is configured to selectively bypass fewer than all of the off-chip interfaces 510 of the subsystem 502 in response to a bypass control (i.e., selection) signal provided by a JTAG data register of the JTAG circuitry 512. Alternatively, in another embodiment (not shown) the multiplexer 518 could be configured to selectively bypass all of the off-chip interfaces 510, similarly to the embodiments described above with regard to FIGS. 3-4.

Figure 6:
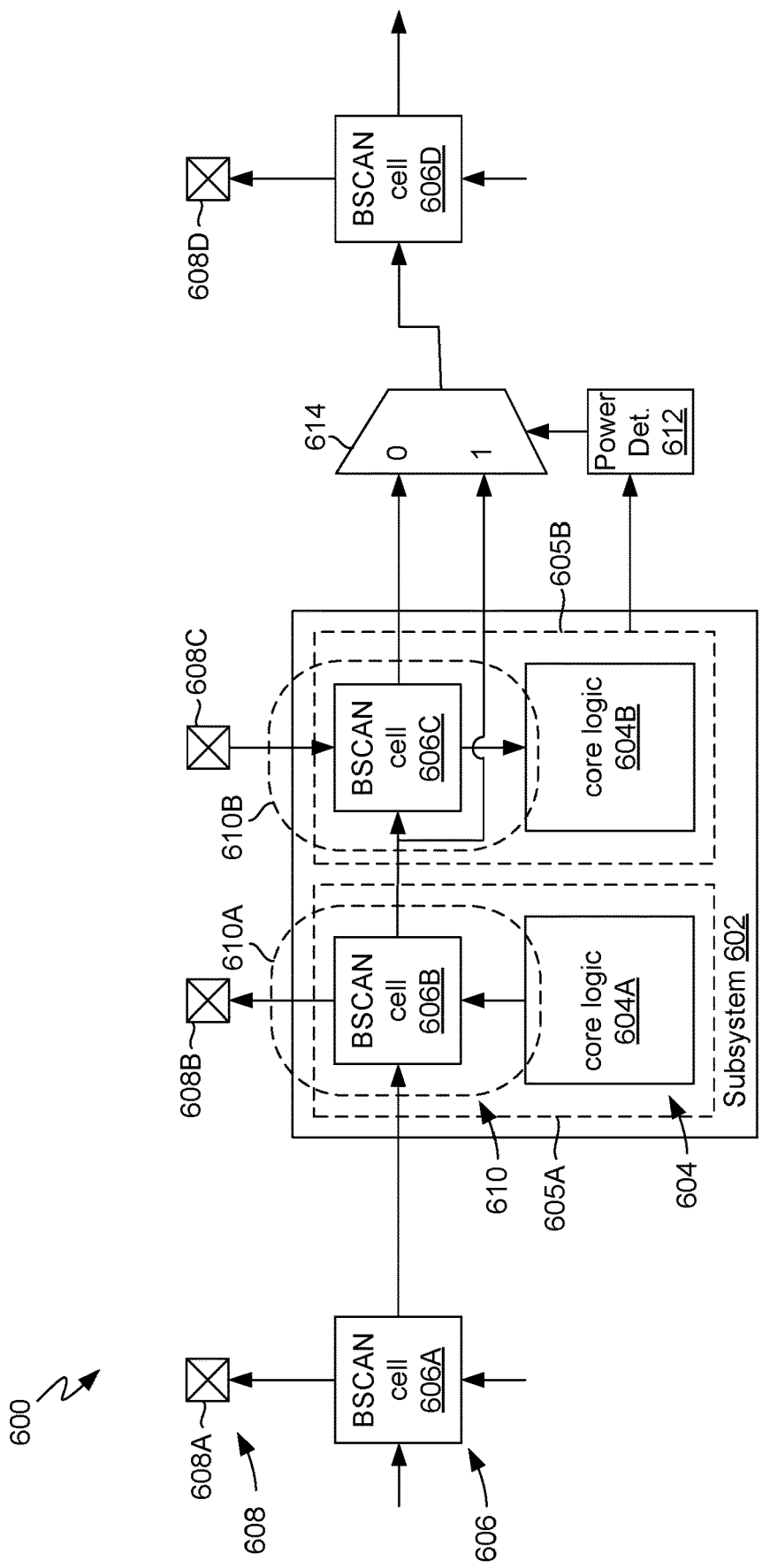
FIG. 6 is a block diagram illustrating yet another system for selectively bypassing off-chip interfaces in a boundary scan chain, in accordance with exemplary embodiments.

As illustrated in FIG. 6, in still another embodiment a chip 600 may include one or more subsystems 602. As in the embodiment described above with regard to FIG. 5, in this embodiment the core logic 604 of the subsystem 602 may be distributed, comprising core logic 604A and 604B. Core logic 604A and 604B may be in power domains 605A and 605B, respectively. As in other embodiments described above, the chip 600 may be an SoC having numerous subsystems 602 and power domains. The chip 300 may include signal pins 308, such as pins 308A, 308B, 308C, 308D, etc., as well as power supply and ground pins (not shown).

The chip 600 may have a boundary scan chain that includes boundary scan cells 606, such as boundary scan cells 606A, 606B, 606C, 606D, etc. The boundary scan cells 606B and 606C are interposed in input/output data signal paths between the subsystem core logic 604 and respective or associated signal pins 608B and 608C. Although any boundary scan cell 606 may be configured as an input, output or bidirectional data buffer, in the illustrated example: the boundary scan cell 606B may be configured as an output buffer, i.e., to buffer data provided by the core logic 604A to the pin 608B; and the boundary scan cell 606C may be configured as an input buffer, i.e., to buffer data provided by the pin 608C to the core logic 604B. The boundary scan cells 606A and 606D may similarly be configured as output buffers in the illustrated example.

In this embodiment, the subsystem 602 may have multiple physical or off-chip interfaces 610, such as a first off-chip interface 610A that includes boundary scan cell 606B and a portion of the associated core logic 604A, and a second off-chip interface 610B that includes boundary scan cell 606C and a portion of the associated core logic 604B. In this embodiment, one or more supply voltage pins may be configured to power off-chip interface 610A (in power domain 605A) and one or more other supply voltage pins may be configured to power off-chip interface 610B (in power domain 605B).

In the portion of the boundary scan chain shown in FIG. 6, the scan chain output of the boundary scan cell 606A is connected to the scan chain input of the boundary scan cell 606B, the scan chain output of the boundary scan cell 606B is connected to the scan chain input of the boundary scan cell 606C, and the scan chain output of the boundary scan cell 606C is connected to the scan chain input of the boundary scan cell 606D. In the illustrated example, boundary scan cells 606B and 606C are associated with core logic 604A and 604B, respectively. Boundary scan cells 606A and 606D may be associated with other subsystems or core logic (not separately shown in FIG. 6 for purposes of clarity).

Although not shown in FIG. 6 for purposes of clarity, the chip 600 may include JTAG circuitry that is configured to control the boundary scan cells 606 and thus control a boundary scan test as described above with regard to other embodiments. Similarly to the embodiment described above with regard to FIG. 4, in this embodiment power signal detection logic 612 is included and configured as bypass control logic to selectively control bypassing the off-chip interface 610B in a manner described below.

The chip 600 may further include one or more multiplexers associated with off-chip interfaces. For example, the multiplexer 614 may be associated with the off-chip interface 610B by the following connections: a first input of the multiplexer 614 is directly connected to the scan chain output of the (interface) boundary scan cell 506C; a second input of the multiplexer 614 is directly connected to the scan chain output of the (predecessor) boundary scan cell 606B; and the output of the multiplexer 614 is directly connected to a scan chain input of the (successor) boundary scan cell 606D.

In the embodiment illustrated in FIG. 6, the power signal detection logic 612 is configured to detect, and to produce a signal indicating, whether the power domain that is configured to supply power to the power domain 605B or portion thereof (e.g., off-chip interface 610B) is powered. This signal indicating whether the power domain is powered serves as a bypass control signal in this embodiment and is accordingly coupled to the selector input of the multiplexer 614.

In response to the bypass control signal, the multiplexer 614 selects one of its above-referenced first and second inputs. For example, in response to the bypass control signal having a value of "0" the multiplexer 614 may select its first input to couple to its output, and in response to the bypass control signal having a value of "1" the multiplexer 614 may select its second input to couple to its output. In the embodiment illustrated in FIG. 6, if the bypass control signal has a value of "0" the multiplexer 614 does not bypass or exclude the boundary scan cell 606C of the interface 610B from the boundary scan chain but rather passes the signal from the (interface) boundary scan cell 606C to the (successor) boundary scan cell 606D. In the embodiment illustrated in FIG. 6, if the bypass control signal has a value of "1" the multiplexer 614 passes the signal from the (predecessor) boundary scan cell 606B to the (successor) boundary scan cell 606D, effectively bypassing or excluding the (interface) boundary scan cell 606C from the boundary scan chain, while maintaining the boundary scan cell 606B in the boundary scan chain. In summary, in this embodiment the multiplexer 614 is configured to selectively bypass fewer than all of the off-chip interfaces 610 of the subsystem 602 in response to a bypass control (i.e., selection) signal provided by the power signal detection logic 612. Alternatively, in another embodiment (not shown) the multiplexer 614 could be configured to selectively bypass all of the off-chip interfaces 610, similarly to the embodiments described above with regard to FIGS. 3-4.

Figure 7:
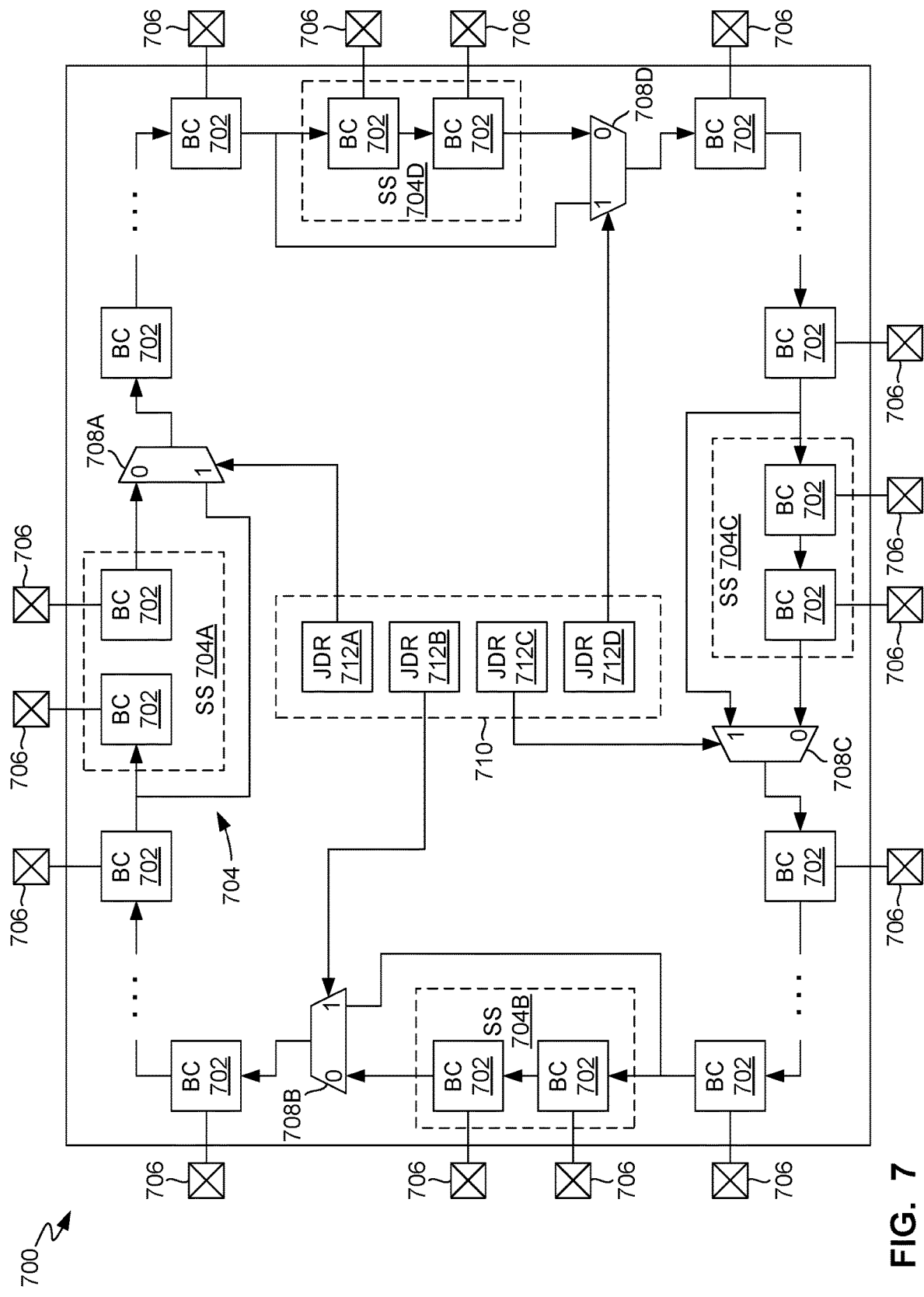
FIG. 7 is a block diagram illustrating a chip having selectively bypassable off-chip interfaces, in accordance with the prior art.

As illustrated in FIG. 7, in another embodiment a chip 700 may have a boundary scan chain comprising any number of boundary scan cells ("BC"s) 702. The chip 700 may include any number of subsystems 704, such as subsystems 704A, 704B, 704C, 704D, etc., each of which may be powered through a different power domain. Each subsystem 704 may include, in addition to the one or more boundary scan cells 702 shown, core logic as described above with regard to other embodiments, although such core logic is not shown in FIG. 7 for purposes of clarity. The boundary scan cells 702 that are included in or associated with each subsystem 704 may be included in an off-chip or physical interface (not separately indicated in FIG. 7) of that subsystem 704. Note in the embodiment illustrated in FIG. 7 that while some of the some of the boundary scan cells 702 are associated with each subsystem 704, others of the boundary scan cells 702 are not associated with any subsystem 704. Such other boundary scan cells 702 may instead be associated with other logic (not shown), such as, for example centralized or system core logic similar to the system core logic 108 described above with regard to FIG. 1. Such other boundary scan cells 702 may be interposed in what are sometimes referred to as general-purpose input/output ("GPIO") data paths. Such system core logic (not shown) may be powered through yet a different power domain than the power domains through which the subsystems 704 are powered.

Each boundary scan cell 702 may be interposed in an input/output data signal path between core logic and a respective or associated signal pin 706 of the chip 700. As in the embodiments described above, in the embodiment illustrated in FIG. 7 any signal pin 706 may serve as an input, output, or bidirectional off-chip connection, depending on the configuration of its associated core logic.

The chip 700 may further include multiplexers 708A, 708B, 708C, and 708D, associated with the subsystems 704A, 704B, 704C, and 704D, respectively. A JTAG data register 710 may comprise a register bit cell 712A having an output coupled to the selector input of the multiplexer 708A, a register bit cell 712B having an output coupled to the selector input of the multiplexer 708B, a register bit cell 712C having an output coupled to the selector input of the multiplexer 708C, and a register bit cell 712D having an output coupled to the selector input of the multiplexer 708D. The JTAG data register 710 may be included in the JTAG circuitry (not separately indicated in FIG. 7) that controls the boundary scan test. Similarly to the embodiments described above with regard to FIGS. 3 and 5, the outputs of the JTAG data register 710 serve as bypass control signals to control whether a selected subsystem 702 is bypassed in the boundary scan chain.

Figure 8:
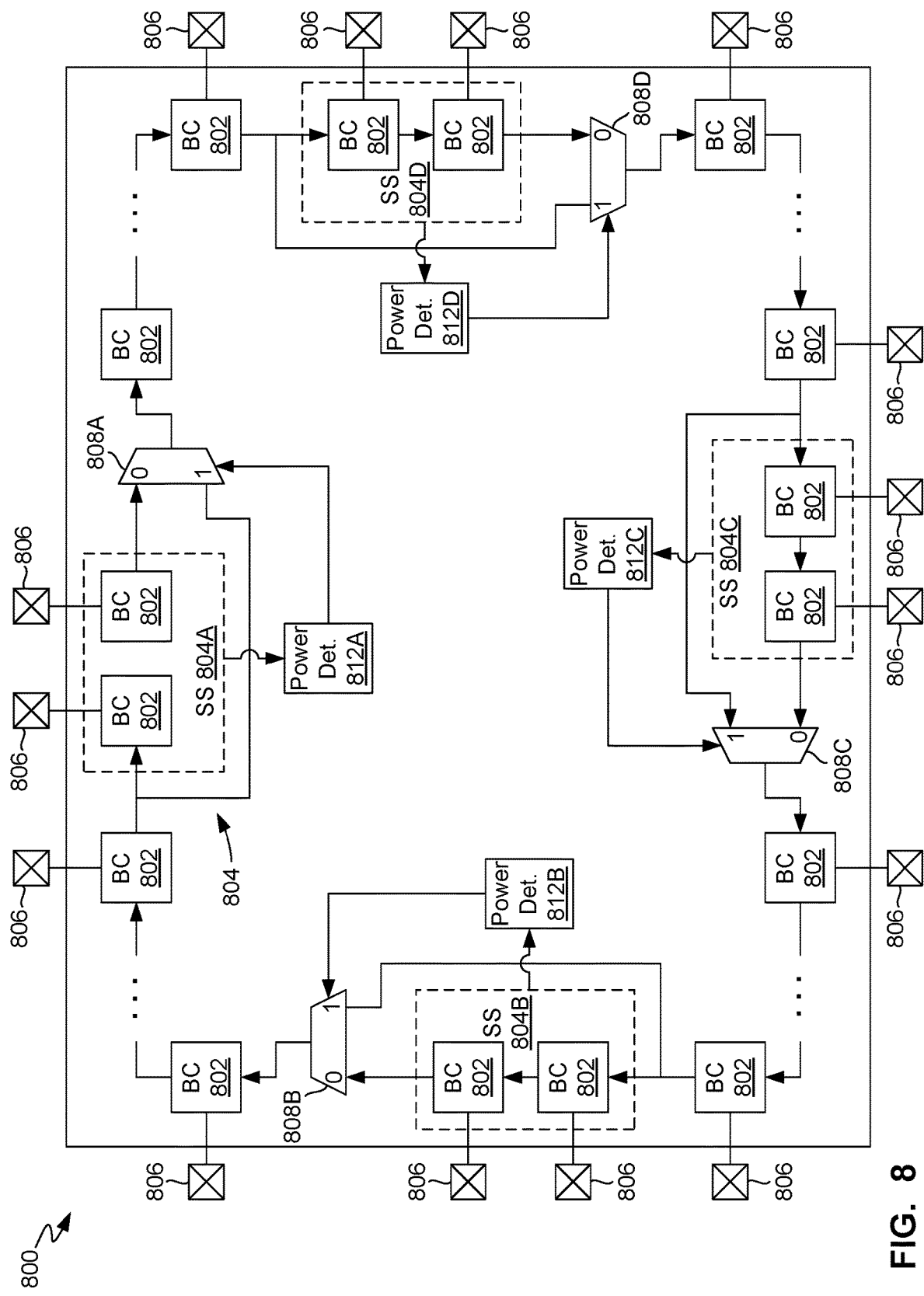
FIG. 8 is a block diagram illustrating another chip having selectively bypassable off-chip interfaces, in accordance with the prior art.

As illustrated in FIG. 8, in a further embodiment a chip 800 may have a boundary scan chain comprising any number of boundary scan cells ("BC"s) 802. The chip 800 may include any number of subsystems 804, such as subsystems 804A, 804B, 804C, 804D, etc., each of which may be powered through a different power domain. Each subsystem 804 may include, in addition to the one or more boundary scan cells 802 shown, core logic as described above with regard to other embodiments, although such core logic is not shown in FIG. 8 for purposes of clarity. The boundary scan cells 802 that are included in or associated with each subsystem 804 may be included in an off-chip or physical interface (not separately indicated in FIG. 8) of that subsystem 804. Similarly to the embodiment described above with regard to FIG. 7, in this embodiment some of the some of the boundary scan cells 802 are associated with each subsystem 804, while others of the boundary scan cells 802 are not associated with any subsystem 804. Such other boundary scan cells 802 may instead be associated with other logic (not shown), such as, for example centralized or system core logic similar to the system core logic 108 described above with regard to FIG. 1. Such other boundary scan cells 802 may be interposed in GPIO data paths. Such system core logic (not shown) may be powered through yet a different power domain than the power domains through which the subsystems 804 are powered.

Each boundary scan cell 802 may be interposed in an input/output data signal path between the above-referenced core logic and a respective or associated signal pin 806 of the chip 800. As in the embodiments described above, in the embodiment illustrated in FIG. 8 any signal pin 806 may serve as an input, output, or bidirectional off-chip connection, depending on the configuration of its associated core logic.

The chip 800 may further include multiplexers 808A, 808B, 808C, and 808D, associated with the subsystems 804A, 804B, 804C, and 804D, respectively. The chip 800 may also include power signal detection logic 812A, 812B, 812C, and 812D. The power signal detection logic 812A, 812B, 812C, and 812D may be configured as bypass control logic to detect, and to produce respective signals indicating, whether the subsystems 802A, 802B, 802D, and 802D are powered. These signals produced by the power signal detection logic 812A, 812B, 812C, and 812D are coupled to the selector inputs of the multiplexers 808A, 808B, 808C, and 808D, respectively. Similarly to the embodiments described above with regard to FIGS. 4 and 6, the boundary scan cells 802 associated with any of the subsystems 804 that are unpowered may be bypassed in the boundary scan chain.

Figure 9:
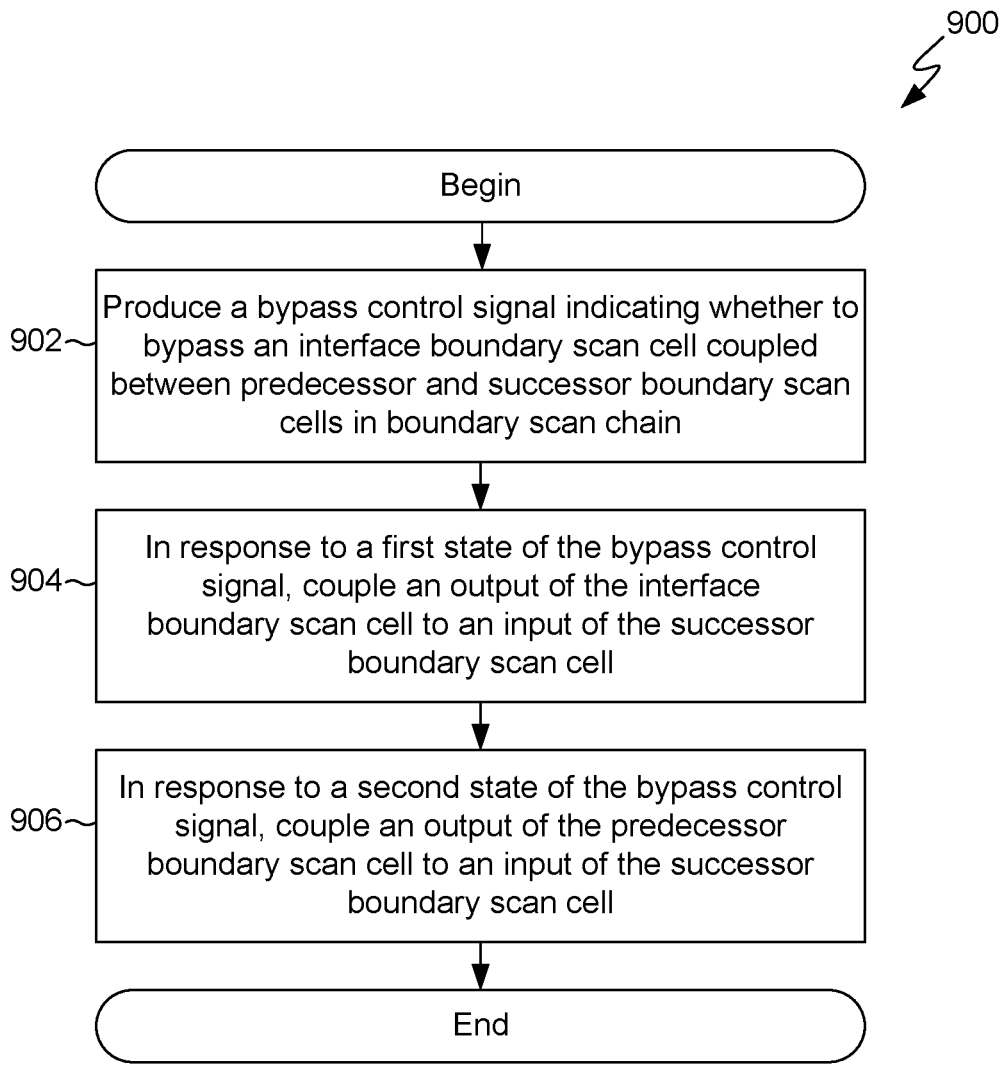
FIG. 9 is a flow diagram illustrating a method for selectively bypassing off-chip interfaces in a boundary scan chain, in accordance with exemplary embodiments.

As illustrated by the flow diagram in FIG. 9, a method 900 for selectively bypassing off-chip interfaces in a boundary scan chain of an integrated circuit chip may include the following. As indicated by block 902, the method 900 may include producing a first bypass control signal indicating whether to bypass a first interface boundary scan cell coupled between a first predecessor boundary scan cell and a first successor boundary scan cell in the boundary scan chain. Registers and power detector circuits are examples of means for performing functions associated with block 902. Although in the exemplary embodiments described with regard to FIGS. 3 and 5, the registers are JTAG data registers, in other embodiments such registers may be of any kind, including, for example, programmable registers, programmable fuses, non-volatile memory locations, etc.

As indicated by block 904, the method 900 may include coupling an output of the first interface boundary scan cell to an input of the first successor boundary scan cell in response to a first state of the bypass control signal. A multiplexer is an example of a means for performing functions associated with block 904. As indicated by block 906, the method 900 may include coupling an output of the first predecessor boundary scan cell to an input of the first successor boundary scan cell in response to a second state of the first bypass control signal. A multiplexer is an example of a means for performing functions associated with block 906.

As described above with regard to FIGS. 3-8, embodiments of systems for selectively bypassing off-chip interfaces in a boundary scan chain of an integrated circuit chip may include any number of off-chip interfaces, subsystems, boundary scan cells, etc. Accordingly, the above-described method 900 may be extended to include further instances of blocks 902-906, relating to further (e.g., second, third, etc.) bypass control signals, and further (e.g., second, third, etc.) predecessor boundary scan cells, further (e.g., second, third, etc.) successor boundary scan cells.

Figure 10:
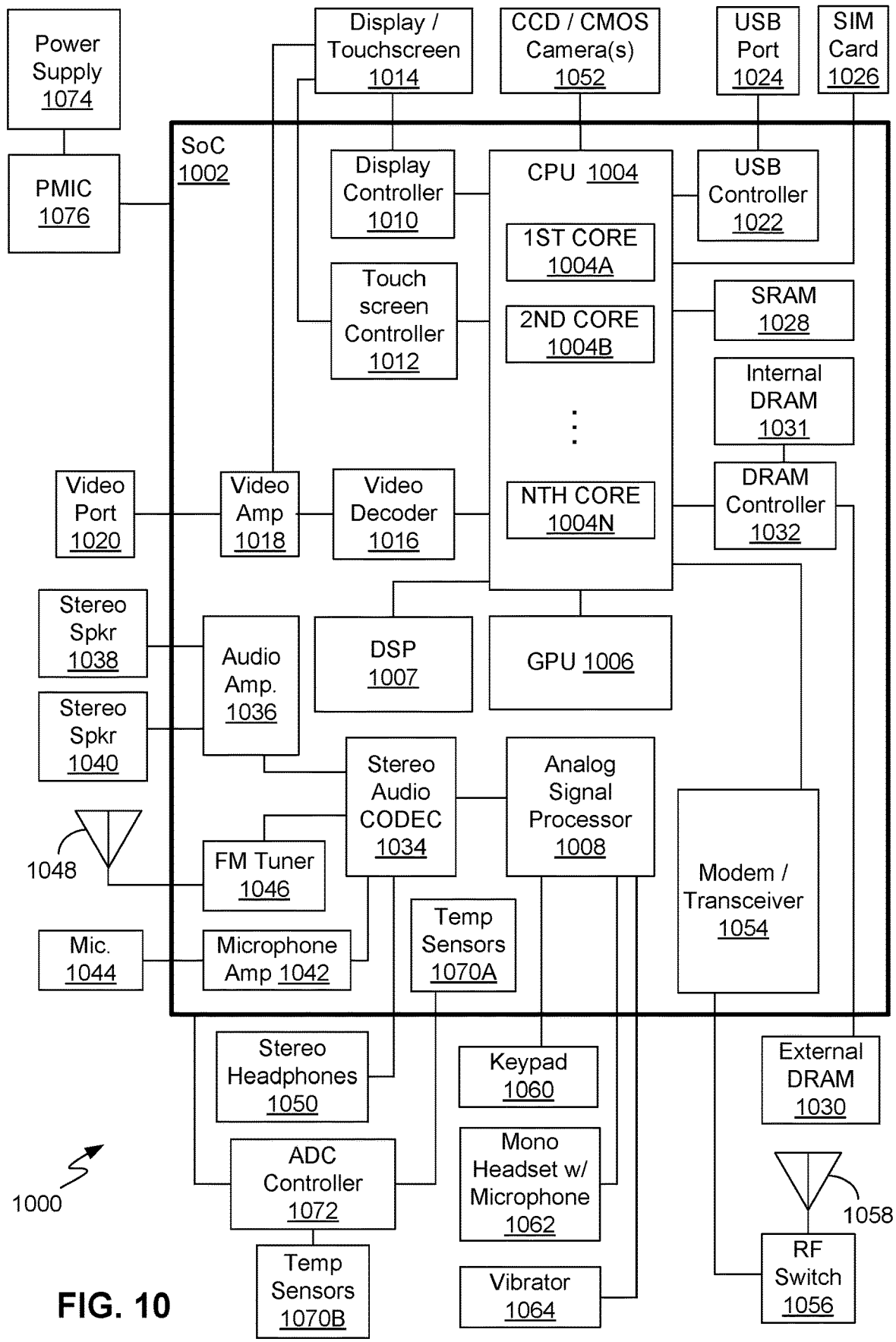
FIG. 10 is a block diagram of a computing device, in accordance with exemplary embodiments.

As illustrated in FIG. 10, exemplary embodiments of systems and methods for selectively bypassing off-chip interfaces in a boundary scan chain of an integrated circuit chip may be provided in a portable computing device ("PCD") 1000.

The PCD 1000 may include an SoC 1002. The SoC may be an example of any of the above-described chips 300 (FIG. 3), 400 (FIG. 4), 500 (FIG. 5), 600 (FIG. 6), 700 (FIG. 7) or 800 (FIG. 8).

The SoC 1002 may include a CPU 1004, a GPU 1006, a DSP 1007, an analog signal processor 1008, or other processors. The CPU 1004 may include multiple cores, such as a first core 1004A, a second core 1004B, etc., through an Nth core 1004N.

A display controller 1010 and a touch-screen controller 1012 may be coupled to the CPU 1004. A touchscreen display 1014 external to the SoC 1002 may be coupled to the display controller 1010 and the touch-screen controller 1012. The PCD 1000 may further include a video decoder 1016 coupled to the CPU 1004. A video amplifier 1018 may be coupled to the video decoder 1016 and the touchscreen display 1014. A video port 1020 may be coupled to the video amplifier 1018. A universal serial bus ("USB") controller 1022 may also be coupled to CPU 1004, and a USB port 1024 may be coupled to the USB controller 1022. The USB interface or a portion thereof may be an example of a bypassable off-chip interface. A subscriber identity module ("SIM") card 1026 may also be coupled to the CPU 1004.

One or more memories may be coupled to the CPU 1004. The one or more memories may include both volatile and non-volatile memories. Examples of volatile memories include static random access memory ("SRAM") 1028 and dynamic RAMs ("DRAM"s) 1030 and 1031. Such memories may be external to the SoC 1002, such as the DRAM 1030, or internal to the SoC 1002, such as the DRAM 1031. A DRAM controller 1032 coupled to the CPU 1004 may control the writing of data to, and reading of data from, the DRAMs 1030 and 1031. In other embodiments, such a DRAM controller may be included within a processor, such as the CPU 1004. The DRAM controller 1032 may be an example of the memory controller 102 (FIG. 1) or 202 (FIG. 2).

A stereo audio CODEC 1034 may be coupled to the analog signal processor 1008. Further, an audio amplifier 1036 may be coupled to the stereo audio CODEC 1034. First and second stereo speakers 1038 and 1040, respectively, may be coupled to the audio amplifier 1036. In addition, a microphone amplifier 1042 may be coupled to the stereo audio CODEC 1034, and a microphone 1044 may be coupled to the microphone amplifier 1042. A frequency modulation ("FM") radio tuner 1046 may be coupled to the stereo audio CODEC 1034. An FM antenna 1048 may be coupled to the FM radio tuner 1046. Further, stereo headphones 1050 may be coupled to the stereo audio CODEC 1034. Other devices that may be coupled to the CPU 1004 include one or more digital (e.g., CCD or CMOS) cameras 1052.

A modem or RF transceiver 1054 may be coupled to the analog signal processor 1008. An RF switch 1056 may be coupled to the RF transceiver 1054 and an RF antenna 1058.

In addition, a keypad 1060, a mono headset with a microphone 1062, and a vibrator device 1064 may be coupled to the analog signal processor 1008.

The SoC 1002 may have one or more internal or on-chip thermal sensors 1070A and may be coupled to one or more external or off-chip thermal sensors 1070B. An analog-to-digital converter ("ADC") controller 1072 may convert voltage drops produced by the thermal sensors 1070A and 1070B to digital signals. A power supply 1074 and a power management integrated circuit ("PMIC") 1076 may supply power to the SoC 1002.

Firmware or software may be stored in any of the above-described memories, such as DRAM 1030 or 1031, SRAM 1028, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer program product," "computer-readable medium," etc., as such terms are understood in the patent lexicon.

Embodiments of systems and methods for selectively bypassing off-chip interfaces in a boundary scan chain may enable a boundary scan test to be performed even though one or more of the off-chip interfaces may be unpowered. Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for selectively bypassing off-chip interfaces in a boundary scan chain of an integrated circuit chip, comprising:

producing a first bypass control signal for a multiplexer indicating whether to bypass a first interface boundary scan cell coupled between a first predecessor boundary scan cell and a first successor boundary scan cell in the boundary scan chain, the first predecessor boundary scan cell and the first interface boundary scan cell being part of a first power domain and having direct connections to the multiplexer, the first successor boundary scan cell and multiplexer being part of a second power domain separate and independent of the first power domain;

coupling with the multiplexer, in response to a first state of the first bypass control signal, an output of the first interface boundary scan cell to an input of the first successor boundary scan cell; and coupling with the multiplexer, in response to a second state of the first bypass control signal, an output of the first predecessor boundary scan cell to an input of the first successor boundary scan cell;

wherein producing the first bypass control signal comprises providing the first bypass control signal from one or more registers included in test circuitry configured to control a boundary scan test using the boundary scan chain.

2. The method of claim 1, wherein the test circuitry conforms to an IEEE 1149.1 standard.

3. The method of claim 1, wherein producing the first bypass control signal for the multiplexer comprises providing the first bypass control signal in response to detecting whether an off-chip interface having the first interface boundary scan cell is powered.

4. A method for selectively bypassing off-chip interfaces in a boundary scan chain of an integrated circuit chip, comprising:
a first interface boundary scan cell in the boundary scan chain, a first predecessor boundary scan cell preceding the first interface boundary scan cell in the boundary scan chain, and a first successor boundary scan cell succeeding the first interface boundary scan cell in the boundary scan chain; the first predecessor boundary scan cell and the first interface boundary scan cell being part of a first power domain and having direct connections to a first multiplexer, the first successor boundary scan cell and the first multiplexer being part of a second power domain separate and independent of the first power domain;
the first multiplexer having a first input coupled to an output of the first interface boundary scan cell, the first multiplexer having a second input coupled to an output of the first predecessor boundary scan cell, the first multiplexer having an output coupled to an input of the first successor boundary scan cell, the output of the first predecessor boundary scan cell further coupled to an input of the first interface boundary scan cell; and
bypass control logic configured to produce a first bypass control signal controlling whether the first multiplexer selects the first input or the second input the bypass control logic comprising one or more registers included in test circuitry configured to control a boundary scan test using the boundary scan chain.

5. The system of claim 4, wherein the bypass control logic is configured to produce the first bypass control signal based on contents of the one or more registers.

6. The system of claim 5, wherein the test circuitry conforms to an IEEE 1149.1 standard.

7. The system of claim 4, wherein the bypass control logic comprises power signal detection logic configured to detect whether an off-chip interface having the first interface boundary scan cell is powered, and further configured to produce the first bypass control signal based on whether the off-chip interface is powered.

8. A system for selectively bypassing off-chip interfaces in a boundary scan chain of an integrated circuit chip, comprising:
a plurality of subsystem off-chip interfaces, each subsystem off-chip interface included in one of a corresponding plurality of power domains of the integrated circuit chip, each subsystem off-chip interface having an interface boundary scan cell and a predecessor boundary scan cell in the boundary scan chain, each predecessor boundary scan cell and the each interface boundary scan cell of each subsystem off-chip interface being part of a separate power domain associated with a respective subsystem off-chip interface;
a plurality of multiplexers, each multiplexer associated with one of the subsystem off-chip interfaces and having a power domain separate from power domains of the off-chip interfaces, each multiplexer having a first input coupled to an output of the interface boundary scan cell, each multiplexer having a second input coupled to an output of a predecessor boundary scan cell preceding the interface boundary scan cell in the boundary scan chain, each multiplexer having an output coupled to an input of a successor boundary scan cell succeeding the interface boundary scan cell in the boundary scan chain, the output of the predecessor boundary scan cell further coupled to an input of the interface boundary scan cell; the successor boundary scan cells and the multiplexers sharing a common power domain which is separate from each power domain of the off-chip interfaces; and
bypass control logic configured to produce a plurality of bypass control signals, each bypass control signal controlling whether a corresponding one of the plurality of multiplexers selects the first input or the second input; the bypass control logic comprising one or more registers included in test circuitry configured to control a boundary scan test using the boundary scan chain.

9. The system of claim 8, wherein the bypass control logic is configured to control the multiplexer based on contents of the one or more registers.

10. The system of claim 9, wherein the test circuitry conforms to an IEEE 1149.1 standard.

11. The system of claim 8, wherein the bypass control logic comprises power signal detection logic configured to detect whether an off-chip interface having the interface boundary scan cell is powered, and further configured to control the multiplexer based on whether the off-chip interface is powered.

12. A system for selectively bypassing off-chip interfaces in a boundary scan chain of an integrated circuit chip, comprising:
means for producing a bypass control signal for a multiplexer indicating whether to bypass an interface boundary scan cell coupled between a predecessor boundary scan cell and a successor boundary scan cell in the boundary scan chain, the first predecessor boundary scan cell and the first interface boundary scan cell being part of a first power domain and having direct connections to the multiplexer, the first successor boundary scan cell and multiplexer being part of a second power domain separate and independent of the first power domain;
means for coupling to the multiplexer, in response to a first state of the bypass control signal, an output of the interface boundary scan cell to an input of the successor boundary scan cell; and
means for coupling to the multiplexer, in response to a second state of the bypass control signal, an output of the predecessor boundary scan cell to an input of the successor boundary scan cell, wherein producing the first bypass control signal comprises providing the first bypass control signal from one or more registers included in test circuitry configured to control a boundary scan test using the boundary scan chain.

13. The system of claim 12, wherein the test circuitry conforms to an IEEE 1149.1 standard.

14. The system of claim 12, wherein the means for producing the bypass control signal for the multiplexer comprises means for providing the bypass control signal in response to detecting whether an off-chip interface having the interface boundary scan cell is powered.

* * * * *